(12) United States Patent
Tobail et al.

(10) Patent No.: US 8,828,504 B2
(45) Date of Patent: Sep. 9, 2014

(54) DEPOSITION OF HYDROGENATED THIN FILM

(75) Inventors: Osama Tobail, Elmsford, NY (US); Ahmed Abou-Kandil, Elmsford, NY (US); Mostafa M. El-Ashry, Elmsford, NY (US); Jeehwan Kim, Los Angeles, CA (US); Paul M. Kozlowski, Poughkeepsie, NY (US); Mohamed Saad, New York, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 868 days.

(21) Appl. No.: 12/971,243

(22) Filed: Dec. 17, 2010

(65) Prior Publication Data

US 2012/0156393 A1    Jun. 21, 2012

(51) Int. Cl.
```
C23C 14/00      (2006.01)
C23C 16/455     (2006.01)
C23C 16/50      (2006.01)
H01L 21/02      (2006.01)
C23C 14/14      (2006.01)
C23C 14/22      (2006.01)
```

(52) U.S. Cl.
CPC ....... *C23C 14/0021* (2013.01); *C23C 16/45514* (2013.01); *C23C 16/50* (2013.01); *H01L 21/02123* (2013.01); *H01L 21/02274* (2013.01); *C23C 14/14* (2013.01); *C23C 14/22* (2013.01)
USPC .......................................... 427/569; 427/575

(58) Field of Classification Search
CPC .... C23C 14/24; C23C 14/32; C23C 14/0021; C23C 14/14
USPC .................................................. 427/569, 575
See application file for complete search history.

(56) References Cited

U.S. PATENT DOCUMENTS

| | | | | | |
|---|---|---|---|---|---|
| 3,069,286 | A | * | 12/1962 | Hall | 427/537 |
| 3,962,988 | A | * | 6/1976 | Murayama et al. | 118/723 VE |
| 4,441,113 | A | * | 4/1984 | Madan | 257/63 |
| 4,514,437 | A | * | 4/1985 | Nath | 427/566 |
| 4,657,774 | A | * | 4/1987 | Satou et al. | 427/527 |
| 4,800,174 | A | * | 1/1989 | Ishihara et al. | 438/96 |
| 4,828,872 | A | * | 5/1989 | Bauer et al. | 427/566 |
| 4,966,095 | A | * | 10/1990 | Ohta et al. | 118/723 VE |
| 5,049,523 | A | * | 9/1991 | Coleman | 438/485 |
| 5,304,250 | A | | 4/1994 | Sameshima | |

OTHER PUBLICATIONS

B. Gorka, et al. "Hydrogen Passivation of Polycrystalline Si Thin Films by Plasma Treatment". 22nd European Photovoltaic Solar Energy Conference, Sep. 3-7, 2007, Milan, Italy.

R. N. Kré, et al, "Optical absorption of the hydrogenated evaporated amorphous silicon". International Journal of the Physical Sciences vol. 5(6), pp. 675-682, Jun. 2010.

V. Grasso, et al, "A New Evaporation Method for Preparing Hydrogenated Amorphous Silicon Films". Solid State Communications, vol. 41, No. 9, 675-677, 1982.

* cited by examiner

*Primary Examiner* — David Turocy
(74) *Attorney, Agent, or Firm* — Louis J. Percello; Otterstedt, Ellenbogen & Kammer, LLP

(57) ABSTRACT

A hydrogenated thin film is formed in a controlled vacuum on a substrate by evaporating one or more solid materials and passing the resulting vapor and a hydrogen-containing gas into a space between two electrodes. One of the electrodes includes openings for allowing the vapor to enter the space. Plasma is generated within the space to cause dissociation of the hydrogen-containing gas and promote a reaction between the material(s) and hydrogen-containing gas.

12 Claims, 2 Drawing Sheets

US 8,828,504 B2

DEPOSITION OF HYDROGENATED THIN FILM

FIELD OF THE INVENTION

The present invention relates to the physical sciences, and, more particularly, to film deposition techniques and the like.

BACKGROUND OF THE INVENTION

Hydrogen passivation is employed for changing the properties of silicon films such as amorphous silicon films and polycrystalline silicon films. Such films may be suitable for electronic and optoelectronic applications. Techniques employed for producing hydrogenated silicon films have included glow-discharge decomposition of silane, reactive sputtering in a hydrogen atmosphere, vacuum evaporation, ion plating, ion-beam sputtering, and mixing evaporated silicon from an electron-beam source with a stream of ionized hydrogen. The addition of hydrogen during the evaporation of germanium has also been shown to improve the electrical properties of the resulting film.

SUMMARY OF THE INVENTION

Principles of the invention provide techniques for the deposition of hydrogenated thin films such as hydrogenated silicon. In one aspect, an exemplary method includes the step of providing a chamber including first and second electrodes. A substrate is positioned in the chamber. A solid material or combination of materials is evaporated in the chamber to form vapor. The method further includes the steps of introducing a hydrogen-containing gas into a space in the chamber between the first and second electrodes and causing the vapor to pass through the second electrode and into the space between the electrodes. Plasma is generated in the space between the first and second electrodes. While the plasma is generated in the space between the electrodes, the vapor passes through the second electrode and the hydrogen-containing gas is introduced into the space between the electrodes, a thin film of hydrogenated material is formed on the substrate.

In a second exemplary method, steps include providing a chamber including a first electrode positioned above a second electrode, a space in the chamber between the first and second electrodes, and a plurality of openings in the second electrode. A substrate having an exposed surface in the space is provided. Vacuum pressure is provided within the chamber and one or more materials are evaporated beneath the second electrode to form a vapor. The vapor passes through the openings in the second electrode and into the space. A hydrogen-containing gas is introduced into the space. Plasma is generated in the space as the hydrogen-containing gas and vapor enter the space. A film comprising the material and hydrogen is formed on the exposed surface of the substrate. In a preferred embodiment, the first electrode is positively biased, the second electrode is negatively biased, and the second electrode includes a substantially equipotential surface.

A system in accordance with the invention comprises a vessel including a chamber therein. A pump is provided for evacuating the chamber. A source for holding one or more materials is present within the chamber and an assembly is provided for evaporating the material(s) present in the source. First and second electrodes are positioned within the chamber, the second electrode including a plurality of openings. A space between the first and second electrodes is provided within the chamber, the openings in the second electrode providing fluid communication between the space and a second portion of the chamber containing the source of materials to be evaporated. An inlet is provided for introducing hydrogen-containing gas between the first and second electrodes. The system further includes a mechanism for generating plasma between the electrodes and causing dissociation of the hydrogen-containing gas.

A further system in accordance with the invention includes a vessel having a chamber, first and second electrodes positioned within the chamber, and a generally horizontal space within the chamber and between the first and second electrodes. The second electrode is positioned beneath the first electrode and includes a plurality of openings that provide fluid communication between the space and a second portion of the chamber. A gas inlet is provided for introducing a gas into the space between the electrodes. An outlet is in fluid communication with the chamber. A mechanism is provided for generating plasma between the first and second electrodes. An assembly is provided for evaporating a solid material in the second portion of the chamber.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer product including a tangible computer readable recordable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a tangible computer-readable recordable storage medium (or multiple such media).

Techniques of the present invention can provide substantial beneficial technical effects. A thin film deposited using such techniques may have enhanced electrical and/or optoelectrical properties and be effectively passivated throughout the thickness of the film. The techniques provided herein can be employed in fabricating thin film solar cells having p-i-n structures and passivating silicon wafers and solar cells by depositing amorphous silicon and amorphous silicon nitride and carbide. Solid carbon is evaporated in fabricating the latter devices.

These and other features and advantages of the present invention will become apparent from the following detailed description of illustrative embodiments thereof, which is to be read in connection with the accompanying drawings.

DETAILED DESCRIPTION OF PREFERRED EMBODIMENTS

A system and method are provided for passivating thin films comprising silicon, germanium, and/or other materials, thereby changing their electrical properties. Unlike some systems that employ plasma-enhanced chemical vapor deposition and silane for depositing hydrogenated silicon, the system and method provided herein does not require the use of silane and can take advantage of commercially available evaporators for depositing silicon and/or other materials while achieving satisfactory passivation.

Figure 1:
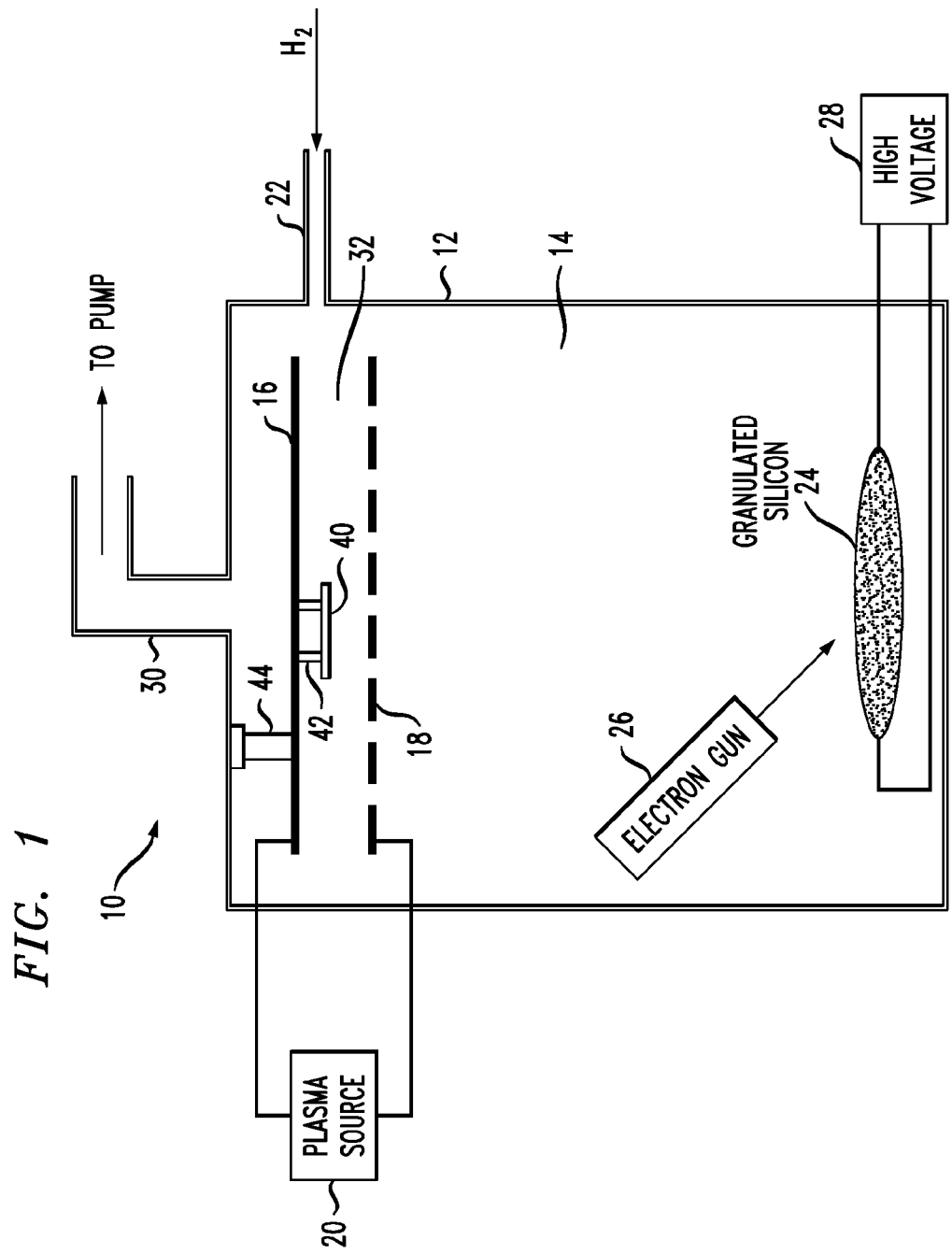
FIG. 1 shows a system for producing hydrogenated thin films.

Referring to FIG. 1, a system 10 is schematically shown for depositing a thin film on a substrate and introducing hydrogen during the deposition of the thin film. The system includes a vessel 12 defining a vacuum chamber 14. A pump (not shown) is in fluid communication with the chamber for evacuating the chamber and controlling pressure therein. Depending on the vacuum range to be maintained in the chamber, the pump can be a turbomolecular pump or other type of vacuum pump.

A first electrode 16 that also functions as a substrate holder is provided for holding one or more substrates. The substrates may be wafers comprising glass or other materials and having exposed surfaces on which thin films comprising silicon are to be deposited. Referring to FIG. 1, the first electrode includes an assembly for maintaining the distance between a substrate 40 and the body of the electrode. In this exemplary embodiment, the substrate 40 is mounted on pins 42 affixed to the electrode. The electrode accordingly will not be covered by an insulating substrate.

A second electrode 18 comprising a grid is positioned within the chamber 14 beneath the first electrode 16. The second electrode includes openings through which vapors can pass. The second electrode is preferably in the form of a grid or mesh, though it can alternatively be a perforated plate or other porous structure capable of both functioning as an electrode while allowing the flow of vapor therethrough. The openings in the grid are preferably evenly distributed throughout and large in number to provide a substantially homogeneous distribution of vapor within the space. The grid or mesh can comprise the entirety of the second electrode or selected portion(s) thereof. The second electrode 18 is preferably constructed to 1) allow as much as possible of the vapor generated in the chamber 14 to pass through it into the space between electrodes, and 2) provide uniform plasma distribution in the space between electrodes. Relatively large openings enhance the flow of vapor but reduce the efficiency of plasma generation. Relatively small opening have the opposite effect. In this exemplary embodiment, a mesh that enables a substantially equipotential surface and hence horizontal field uniformity while allowing reasonable vapor flow is preferred. Specific opening dimensions and shapes may be optimized for particular processes. For example, relatively small mesh openings used for processes involving a relatively high evaporation rate of the solid(s) within the chamber 14 may provide results equivalent to using relatively large mesh openings where the solid(s) are evaporated at a relatively low rate.

Both the first and second electrodes are comprised of metal. Each preferably has a plate-like configuration and similar dimensions. The opposing surfaces of the first and second electrode are preferably arranged substantially horizontally and substantially parallel to each other and are similar in area. The second electrode is preferably constructed, positioned and sized such that most of the silicon vapor generated in the portion of the chamber below the electrodes flows through the mesh portion of the electrode and into the space 32 between the two electrodes. The spacing between the electrodes is preferably adjustable. An adjustment mechanism 44 is shown for adjusting the horizontal position of the first electrode 16. The adjustment mechanism can include one or more micrometer screws or other type of mechanism that allows manual or remote actuation. In this exemplary embodiment, the space 32 between electrodes is about one centimeter, but can be made narrower or wider depending on other operating parameters.

A plasma source 20 is connected between the first electrode 16 and the second electrode 18. The source voltage can be constant or alternating. RF signals may be applied between the electrodes. Plasma can be in a constant mode or a pulsed mode. In a pulsed mode, an RF source is modulated with a rectangular waveform. In the preferred embodiment, the first electrode 16 is negatively biased and the second electrode 18 is positively biased during film deposition. A constant bias facilitates the drift of hydrogen ions towards the substrate where film deposition takes place. An inlet 22 is in fluid communication with the chamber 14 and positioned for introducing a hydrogen-containing gas such as $H_2$ or $NH_3$ into the space between the first electrode 16 and the second electrode 18. The inlet 22 and/or other structures (not shown) are preferably arranged such that hydrogen-containing gas is directed towards the space between electrodes and uniformly distributed therein.

An assembly is provided for evaporating one or more solid materials within the chamber 14. The assembly includes a source 24 of one or more solid materials such as silicon, germanium and/or carbon within the chamber 14. In this exemplary embodiment, silicon in granulated form is provided in a crucible. An electron gun 26 is directed towards the source 24. A high voltage source 28 is connected across the source 24. At low pressure, the solid material evaporates at a much lower temperature than at atmospheric pressure. Pressure is maintained between $10^{-3}$ and $10^{-9}$ Torr, and preferably about $10^{-5}$ Torr in this exemplary embodiment. Electrons are caused to bombard the surface of the solid material, transferring their energy to the atoms/molecules comprising the source material and resulting in sublimation. Some of the energy is converted to heat that can be dissipated to a cooling system (not shown) to avoid crucible melting and/or contamination diffusion from the crucible to the solid source material. Doping of the evaporated material is possible by evaporating doped source material such as heavily doped silicon. Boron doped silicon thin films can be formed on the substrate in this manner. Intrinsic silicon is deposited by evaporating granular intrinsic silicon. It will be appreciated that a thermal evaporation system may be employed instead of the electron beam evaporation system.

In operation, the system may be employed to cause the hydrogenation of solid silicon and/or other material(s) prior to and during its deposition on the substrate. The substrate is affixed to the first electrode 16 such that a surface thereof on which a thin film of hydrogenated material is to be deposited faces the second electrode. The substrate temperature can be maintained between room temperature and 500° C., and more preferably between 100-300° C. A controlled flow of hydrogen-containing gas is introduced through the inlet 22 and is directed into the space 32 between the two electrodes. The material is evaporated, causing the formation of vapor in the chamber portion below the electrodes. A shutter (not shown) or other functionally similar structure is preferably employed for restricting the flow of vapor into the space between electrodes until a steady state is reached. The chamber is maintained at a selected vacuum pressure, about $10^{-5}$ Torr in this exemplary embodiment, by actuation of the pump associated with the outlet 30 above the electrodes. Plasma is generated between the electrodes and causes the gas (e.g. hydrogen) to dissociate. The surface of the second electrode adjoining the space is preferably substantially equipotential due to its configuration, and plasma distribution is substantially uniform. The vapor reacts with the hydrogen-containing gas in the plasma zone and is deposited on the substrate as a hydrogenated film forms and grows on the surface of the substrate. Hydrogen atoms may also diffuse into the silicon following film deposition on the substrate. The mesh electrode and local plasma help to provide a relatively homogeneous, hydrogenated thin film on the exposed surface of the substrate. Depending on the materials evaporated or coevaporated and the elements comprising the hydrogen-containing gas, the thin film may comprise a variety of elements.

Given the discussion thus far, it will be appreciated that, in general terms, an exemplary method, according to an aspect of the invention, includes the step of providing a chamber including first and second electrodes and a substrate within the chamber. The substrate may be mounted to the first electrode. Further steps include evaporating silicon, germanium, and/or other materials within the chamber to form vapor and introducing a hydrogen-containing gas into the space in the chamber between the electrodes. The vapor is caused to pass through the second electrode, which preferably includes a plurality of openings that allow the vapor to be distributed substantially uniformly throughout the space. Plasma is generated in the space while a thin film grows on the substrate and vapor and hydrogen-containing gas continue to enter the space. A relatively homogeneous distribution of hydrogen atoms within the film is possible using the exemplary method. The disclosed system allows a relatively large substrate to be processed. One or more substrates may be processed at the same time. The use of hazardous gases such as diborane and phosphine is not necessary using this method.

It will further be appreciated that the principles of the disclosed technique can be extended to employ pulsed laser deposition techniques. Doping can be provided by evaporating material containing phosphorus or boron atoms. SiNx could be deposited by using an ammonia ($NH_3$) and hydrogen ($H_2$) gas mixture.

In some instances, the method as described above is used in the fabrication of integrated circuit chips. The resulting integrated circuit chips can be distributed by the fabricator in raw wafer form (that is, as a single wafer that has multiple unpackaged chips), as a hare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, for example, solar cell assemblies.

Exemplary System and Article of Manufacture Details

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of the invention, or elements thereof, can be implemented in the form of an apparatus including a memory and at least one processor that is coupled to the memory and operative to perform exemplary method steps such as maintaining pressure, temperature, hydrogen flow and/or evaporation rate.

Figure 2:
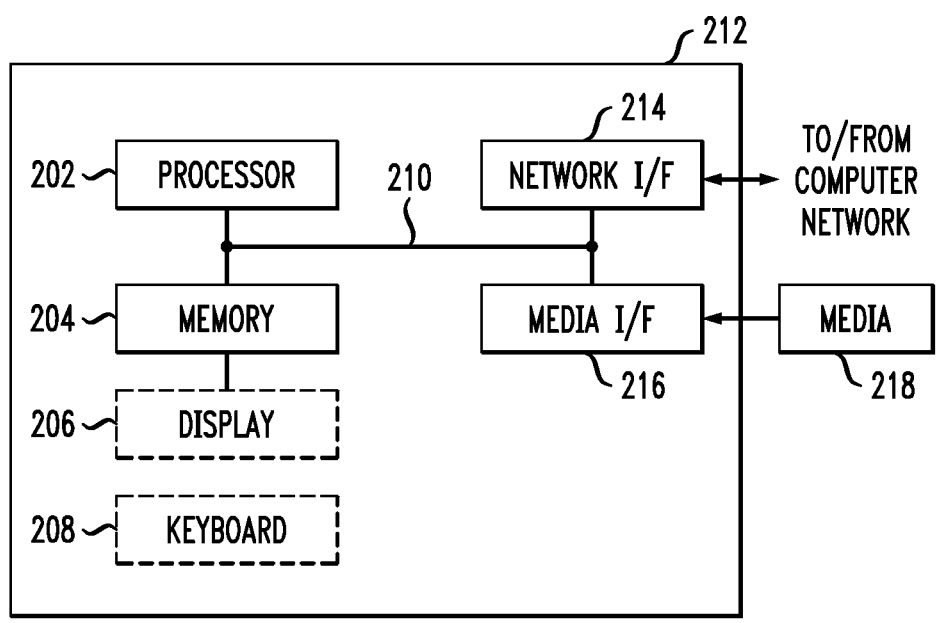
FIG. 2 depicts a computer system that may be useful in implementing one or more aspects and/or elements of the invention.

One or more embodiments can make use of software running on a general purpose computer or workstation. With reference to FIG. 2, such an implementation might employ, for example, a processor 202, a memory 204, and an input/output interface formed, for example, by a display 206 and a keyboard 208. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 202, memory 204, and input/output interface such as display 206 and keyboard 208 can be interconnected, for example, via bus 210 as part of a data processing unit 212. Suitable interconnections, for example via bus 210, can also be provided to a network interface 214, such as a network card, which can be provided to interface with a computer network, and to a media interface 216, such as a diskette or CD-ROM drive, which can be provided to interface with media 218.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 202 coupled directly or indirectly to memory elements 204 through a system bus 210. The memory elements can include local memory employed during actual implementation of the program code, hulk storage, and cache memories which provide temporary storage of at least some program code in order to reduce the number of times code must be retrieved from bulk storage during implementation.

Input/output or I/O devices (including but not limited to keyboards 208, display's 206, pointing devices, and the like) can be coupled to the system either directly (such as via bus 210) or through intervening I/O controllers (omitted for clarity).

Network adapters such as network interface 214 may also be coupled to the system to enable the data processing system to become coupled to other data processing systems or remote printers or storage devices through intervening private or public networks. Modems, cable modem and Ethernet cards are just a few of the currently available types of network adapters. Data from sensors for pressure, temperature, hydrogen flow and/or evaporation rate, or the like, could be acquired over the network; via an analog-to-digital converter or other interface connected to bus 210; or the like.

As used herein, including the claims, a "server" includes a physical data processing system (for example, system 212 as shown in FIG. 2) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 218 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, modules for processing data from sensors or the like and in response controlling pressure, temperature, hydrogen flow and/or evaporation rate. The method steps can then he carried out using the distinct software modules and/or sub-modules of the system, as described above, executing on one or more hardware processors 202. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
    providing a chamber including first and second electrodes, the second electrode including a plurality of openings;
    providing a substrate within the chamber beneath the first electrode and having an exposed surface facing the second electrode;
    providing vacuum pressure within the chamber;
    evaporating a solid material within the chamber to form vapor;
    introducing a hydrogen-containing gas into a space in the chamber between the first and second electrodes;
    causing the vapor to pass through the plurality of openings in the second electrode and to provide a substantially homogeneous distribution of the vapor within the space between the electrodes;
    generating substantially uniformly distributed plasma in the space between the first and second electrodes, and
    forming a thin film of hydrogenated material on the substrate while: generating the substantially uniformly distributed plasma in the space between the electrodes, causing the vapor to pass through the plurality of openings in the second electrode and into the space between the first and second electrodes, and introducing the hydrogen-containing gas into the space between the first and second electrodes.

2. The method of claim 1 wherein the solid material comprises at least one of silicon and germanium.

3. The method of claim 2 further including the step of maintaining a negative bias with respect to the first electrode and a positive bias with respect to the second electrode.

4. The method of claim 1 further including the step of mounting the substrate to the first electrode in the space between the first and second electrodes.

5. The method of claim 1 further including the step of directing the hydrogen-containing gas into the space between the first and second electrodes.

6. The method of claim 1, further including the step of maintaining a distance between the substrate and the first electrode.

7. The method of claim 1 further comprising:
    restricting a flow of the vapor into the space between the first and second plate-like electrodes until a steady state is reached.

8. A method comprising:
    providing a chamber including a first plate-like electrode positioned above and substantially parallel to a second plate-like electrode, a space in the chamber between the first and second plate-like electrodes, the second plate-like electrode having a substantially equipotential surface adjoining the space, and a plurality of openings in the second electrode;
    providing a substrate within the space between the first and second plate-like electrodes and spaced by a distance from the first plate-like electrode, the substrate having an exposed surface facing the equipotential surface of the second electrode;
    providing vacuum pressure within the chamber;
    evaporating a material in the chamber beneath the second electrode to form vapor;
    causing the vapor to pass through the openings in the second electrode and to be distributed substantially homogeneously throughout the space;
    causing the first and second plate-like electrodes to be oppositely biased;
    directing a hydrogen-containing gas into the space,
    generating substantially uniformly distributed plasma in the space as the hydrogen-containing gas and vapor enter the space, and
    forming a film comprising the material and hydrogen on the exposed surface of the substrate.

9. The method of claim 8 wherein the step of causing the first and second plate-like electrodes to be oppositely biased further includes the step of maintaining a negative bias with respect to the first electrode and a positive bias with respect to the second electrode.

10. The method of claim 9 further including the step of adjusting the distance between the first and second plate-like electrodes.

11. The method of claim 9 wherein the second plate-like electrode comprises a mesh, the mesh including a substantially uniform distribution of said openings.

12. The method of claim 8 wherein the material comprises at least two or more elements, further including the step of coevaporating the at least two or more elements in the chamber beneath the second plate-like electrode.

* * * * *